United States Patent
Doerr et al.

(10) Patent No.: US 6,359,912 B1
(45) Date of Patent: Mar. 19, 2002

(54) MULTIPLE WAVELENGTH LASER HAVING A REDUCED NUMBER OF WAVELENGTH CONTROLS

(75) Inventors: Christopher Richard Doerr, Middletwon Township, Monmouth County; Corrado Pietro Dragone, Little Silver Township, Monmouth County; Alastair Malcolm Glass, Rumson Township, Monmouth County, all of NJ (US)

(73) Assignee: Lucent Technologies, Inc., Murray Hill, NJ (US)

(*) Notice: Subject to any disclaimer, the term of this patent is extended or adjusted under 35 U.S.C. 154(b) by 0 days.

(21) Appl. No.: 09/400,239

(22) Filed: Sep. 21, 1999

(51) Int. Cl.$^7$ .................................................. H01S 3/30
(52) U.S. Cl. ............................... 372/4; 372/20; 372/102; 372/32
(58) Field of Search .............................. 372/4, 20, 102, 372/32, 94; 359/109, 195, 193, 179, 114, 115, 161; 330/257, 252, 250; 326/104, 124, 126; 327/365, 419, 427, 432, 433; 385/45, 15, 39

(56) References Cited

U.S. PATENT DOCUMENTS

| | | | | |
|---|---|---|---|---|
| 5,373,517 A | * | 12/1994 | Dragone et al. | 372/20 |
| 5,444,725 A | * | 8/1995 | Zirngibl | 372/20 |
| 5,913,000 A | * | 6/1999 | Doerr et al. | 385/46 |
| 6,023,480 A | * | 2/2000 | Dragone | 372/23 |
| 6,023,544 A | * | 2/2000 | Dragone | 385/37 |
| 6,243,402 B1 | * | 6/2001 | Doerr | 372/20 |

OTHER PUBLICATIONS

"Arrayed–Waveguide grating lasers and their applications to tuning–free wavelength routing" by Y. Tachikawa et al, IEE Proc.—Optoelectron., vol. 143, No. 5, pp. 322–328, Oct. 1996.

\* cited by examiner

Primary Examiner—Frank G. Font
Assistant Examiner—Delma R. Flores Ruiz
(74) Attorney, Agent, or Firm—John A. Caccuro

(57) ABSTRACT

An integrated, single output port, tunable multiple wavelength laser apparatus produces one of $N_a$ $N_b$ wavelengths using only $N_a$ plus $N_b$ selection signals. Each of $N_b$ ports can output $N_a$ of the laser wavelengths, the port being selected by the $N_b$ control signals and the particular one of the $N_a$ wavelengths being selected by the $N_a$ control signal. An $N_b \times 1$ router combines the signals from the $N_b$ output ports into a single output.

10 Claims, 5 Drawing Sheets

MULTIPLE WAVELENGTH LASER HAVING A REDUCED NUMBER OF WAVELENGTH CONTROLS

CROSS-REFERENCE TO RELATED APPLICATION

Related subject matter is disclosed in the concurrently filed application entitled "A BROADBAND ELECTRONIC N×N CROSS-CONNECT SWITCH USING TUNABLE LASERS by the inventors, C. R. Doerr, C. P. Dragone, I. P. Kaminow and A. M. Glass, both applications being assigned to the same Assignee.

TECHNICAL FIELD OF THE INVENTION

The present invention relates to a multiple wavelength laser and, more particularly, to a multiple wavelength laser configuration characterized by $N=N_a N_b$ output wavelengths selected using only $N_a+N_b$ control signals.

BACKGROUND OF THE INVENTION

Wavelength division multiplexing (WDM) allows high transmission capacity by allowing many wavelengths to be simultaneously transmitted in each fiber. An important device that is needed at each WDM node is a broadband cross-connect switch for providing complete connectivity between incoming and outgoing fibers. Such a cross-connect switch can be realized by combining a waveguide grating router with a set of tunable lasers. A tunable lasers can be simply realized by using an N×1 router as described in the article "Chromatic focal plane displacement in parabolic chirped waveguide grating router" by C. Doerr et al, published in IEEE Photon. Technol. Lerr., vol. 9, pp. 627–635, May 1997. However, in such an arrangement N controls are needed and such laser may be difficult to realize in integrated form for large N. A tunable laser having a reduced number of controls is described in the article entitled "Arrayed-Waveguide grating lasers and their applications to tuning-free wavelength routing" by Y. Tachikawa et al, IEE Proc.-Optoelectron., Vol 143, No. 5, pp. 322–328, October 1996. However, the article does not describe a practical way to integrate a single output tunable laser.

Therefore, there is a continuing need for an integrated single output tunable laser having a reduced number of wavelength selection controls.

SUMMARY OF THE INVENTION

In accordance with the present invention, we disclose an integrated, single output port, tunable multiple wavelength laser having $N=N_a N_b$ output wavelengths selected using only $N_a+N_b$ control signals. Each of $N_b$ ports can output $N_a$ of the laser wavelengths, the port being selected by the $N_b$ control signals and the particular one of the $N_a$ wavelengths being selected by the $N_a$ control signal. An $N_b \times 1$ router combines the signals from the $N_b$ output ports into a single output.

In another embodiment, the laser apparatus comprises a waveguide grating router including a first and second free-space regions connected by a plurality of waveguide arms having a quadratic path length variation. The input side of the first free-space region includes $N_a$ input waveguides each separated by a spacing "a" and each including a reflective termination which is controlled by a separate one of a first group of control signals, $1-N_a$. The output side of the second free-space region includes $N_b$ output waveguides each separated by a spacing "b", where "a" is equal to $N_b$ times "b", each output waveguide including a reflective termination which is controlled by a separate one of a second group of control signals, $1-N_b$, each reflective termination being partially transmitting and connected as a different one of the $N_b$ output ports of the laser. In yet another embodiment, the laser is connected to a $N_b \times 1$ router that combines the $N_b$ outputs from the laser into a single output.

BRIEF DESCRIPTION OF THE DRAWINGS

In the drawings.

In the following description, identical element designations in different figures represent identical elements. Additionally in the element designations, the first digit refers to the figure in which that element is first located (e.g., 104 is first located in FIG. 1).

DETAILED DESCRIPTION

One technique for reducing the number of wavelength selection controls of a multiple wavelength laser, for instance by a factor P, is by including temperature tuning of the lasers. Thus by dividing the set of N wavelengths into Q groups, each consisting of a comb of P wavelengths, one obtains the set of wavelengths $\lambda_{i,r}$, with $i=1, \ldots, P$ and $r=1, \ldots, Q$ where $\lambda_{i,r}$ is the r-th wavelength of the i-th group. Now P controls are needed to change i, and the value of r can be changed by temperature tuning. Therefore, each laser can be realized by using a P×1 router with P controls. Each laser is capable, at any particular temperature, of P equally spaced wavelengths, each belonging to a particular comb. Moreover, for any control choice, any of the Q wavelengths for $r=1, \ldots, Q$ can be produced by temperature tuning. In this manner P×Q=N different wavelengths are produced by each laser 101. However, temperature tuning is typically slow and only small values of Q can be realized realistically.

Figure 1:
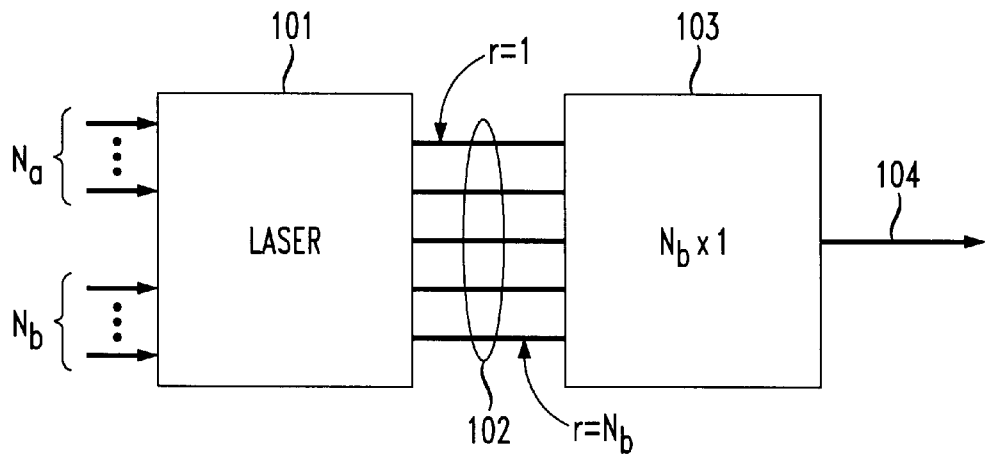
FIG. 1 shows a block diagram of our multifrequency laser having $N_b$ output ports connected to an $N_b \times 1$ router.

In accordance with the present invention, we describe our technique for reducing the number of controls for a multiple wavelength laser by including several output ports in each laser. Shown in FIG. 1 is a block diagram of our multifrequency laser 101 having $N_b$ output ports 102 connected to an $N_b \times 1$ router 103. Our multiple wavelength laser can produce any one of $N_a$ different wavelengths available at each of the $N_b$ output ports. Thus a total of $N=N_a N_b$ different output wavelengths may be selected using only $N_a + N_b$ control signals. The $N_a$ controls are used to select a wavelength from the $N_a$ different wavelengths available at each of $N_b$ output ports (e.g., 201 of FIG. 2) and the $N_b$ controls are used to select the port (e.g., 201 of FIG. 2) which is to output the wavelength selected by the $N_a$ controls. For some applications it may be desirable to have the wavelengths from the a multiple wavelength laser available from one port. In such an application, an $N_b \times 1$ wavelength router 103 is connected to combine the outputs from the $N_b$ output ports 102 of laser 101 into one signal that is outputted at a single output port 104.

Our multifrequency laser 101 and router 103 arrangement of FIG. 1 can be readily integrated using known technology to provide a large number $N=N_a N_b$ of wavelengths.

Figure 2:
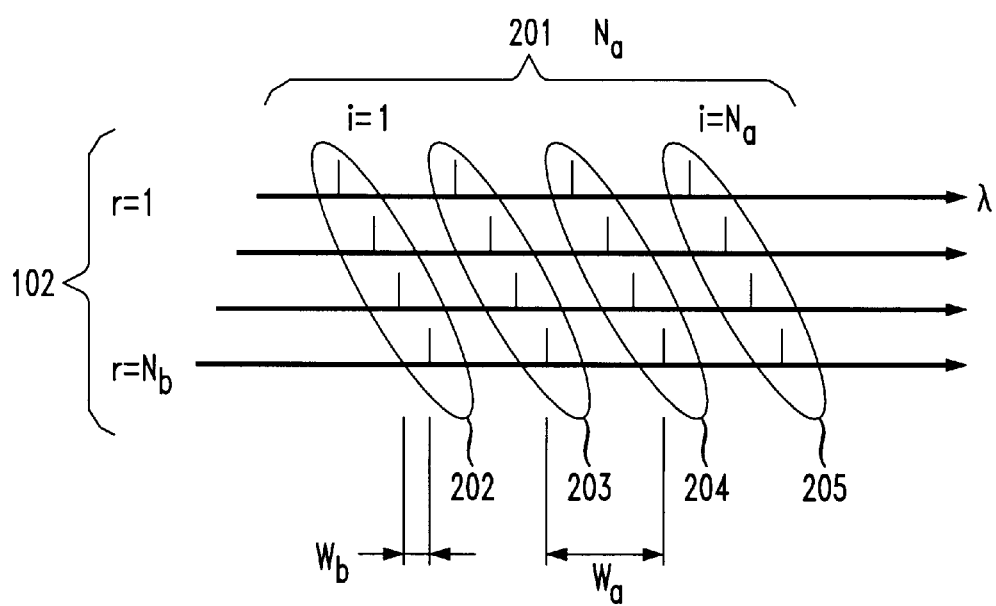
FIG. 2 shows the combs of wavelengths produced at the various $N_b$ output ports of the laser of FIG. 1.

Shown in FIG. 2 are the $N_b$ combs 102 of $N_a$ wavelengths 201 produced at each of the various $N_b$ output ports 102 of the laser of FIG. 1. Notice that the spacing $w_a$ of the wavelengths of a particular comb is the same for all combs. Therefore, it is possible to transfer each of the $N_a$ wavelength combs 201 to one output port, 104 of FIG. 1, by combining the laser 101 with a wavelength router 103. The wavelength router 103 has wavelength spacing $w_b$ and a free-spectral range $w_a$. The wavelength router 103 is designed so that it transfers the first wavelength 202 of each comb 201 to its output port. Thus, since the router wavelength behavior is essentially periodic with period $w_a$, each subsequent wavelength 203–205 of each comb 201 is transferred to the output port. Note that the router wavelengths of maximum transmission are determined by the locations of the various input waveguides along the boundary of the router free-space region. Therefore, by properly choosing these locations, any specified values of the first wavelength of the various combs can be chosen. In particular these wavelengths need not be equally spaced.

Figure 3:
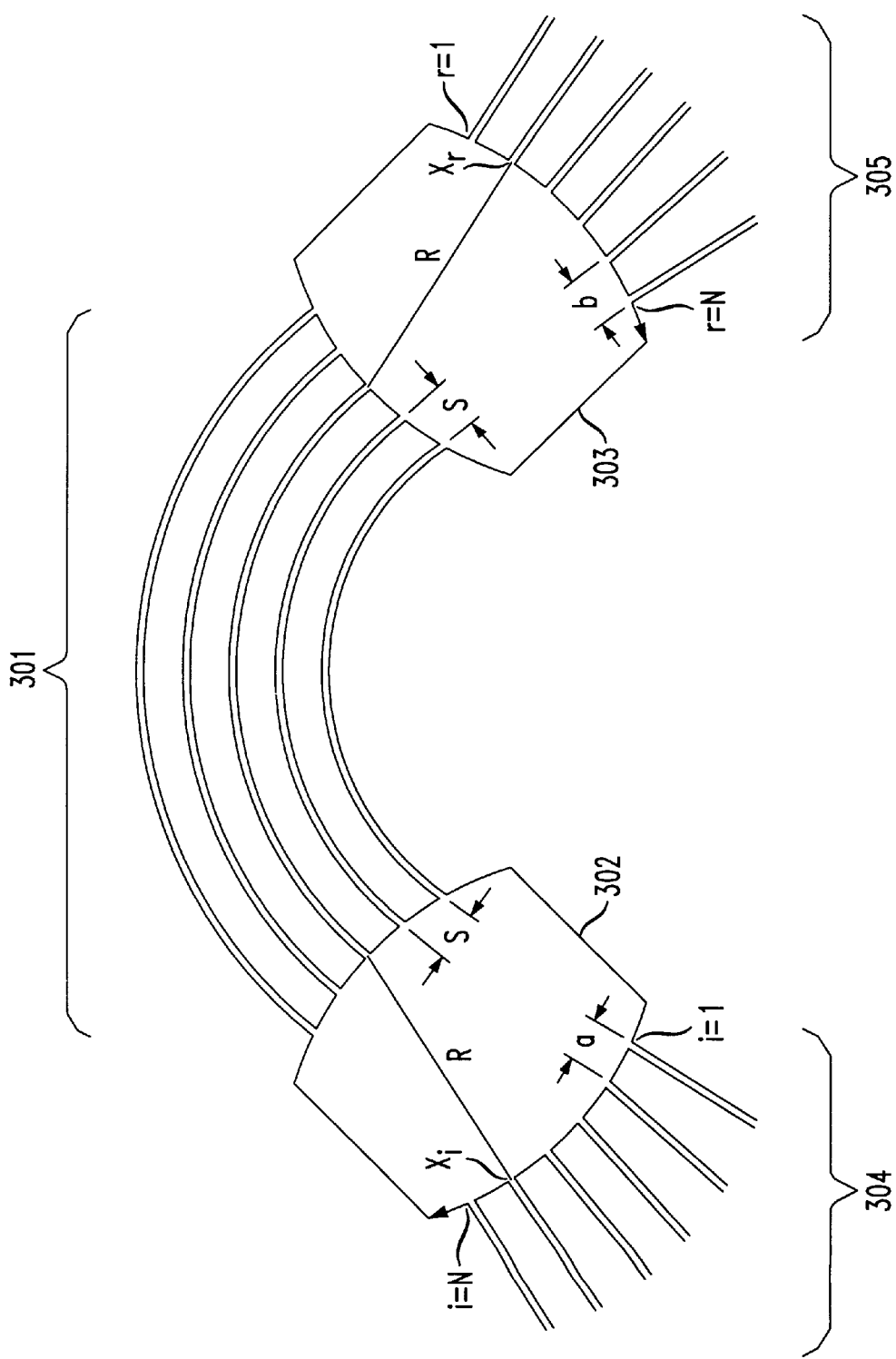
FIG. 3 shows a waveguide grating router consisting of a waveguide grating between two free-space regions. The input and output waveguides are spaced by a and b along the input and output boundaries of the router.

The router 103 in FIG. 1 can be realized in integrated form as shown in FIG. 3 by using an imaging arrangement of waveguides (arms) or grating 301 having a constant pathlength difference. The grating 301 is placed between two dielectric slabs forming two planar free-space regions 302 and 303 on a substrate. The input 304 and output 305 waveguides are connected to the input and output boundaries of the two free-space regions 302 and 303, respectively. In a conventional router each transmission coefficient between two particular ports has essentially periodic behavior characterized by equally spaced peaks, and each peak is produced by a particular order m of the grating. For instance, the wavelengths of maximum transmission from the i-th input waveguide, $x_i$, to the output r-th waveguide, $x_r$, are specified by the relation $$\frac{x_i - x_r}{R} = \frac{m\lambda - m_0 \lambda_0}{S} \qquad (1)$$

where $x_i$, $x_r$ are the coordinates specifying the locations of the two waveguides, m is the order of the grating, S is the spacing of the receiving and transmitting ends of the arms, $m_0$ is a particular value of m, $\lambda_0$ is a particular design wavelength, R is the radial distance of the input waveguides from the central arm of the grating, and the same distance R is assumed between central arm and the output waveguides. We initially let the spacing a of the input waveguides be equal to the spacing b of the output waveguides and choose $$a = b = \frac{1}{N} \frac{R\lambda_0}{S} \qquad (2)$$

Figure 4:
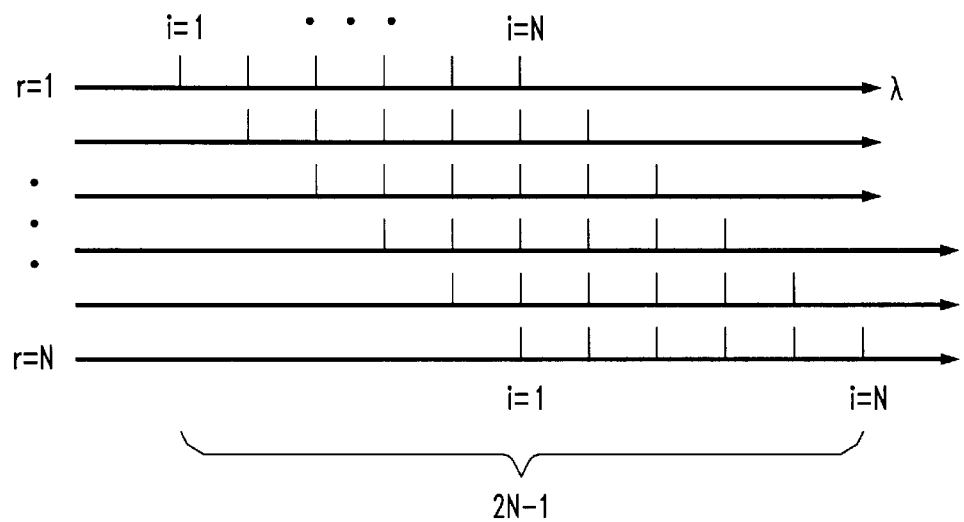
FIG. 4 shows the wavelengths of maximum transmission produced by a particular order $m_o$ of a conventional N×N router when the input and output waveguides are equally spaced by a=b along the input and output boundaries of the two free-space regions.

FIG. 4 shows the wavelengths of maximum transmission produced by a particular order $m_o$ of a conventional N×N router, e.g., FIG. 3, when the input and output waveguides are equally spaced by a=b along the input and output boundaries of the two free-space regions.

Then in Eq (2) letting $$x_a = ia, \; x_b = rb, \qquad (3)$$

we find from (1) that the wavelengths of maximum transmission from input port i to output port r for a particular order $m = m_0$ are approximately given by $$\lambda_{i,r} \simeq \lambda_0 + (i-r)w, \qquad (4)$$

where w denotes the wavelength spacing. More generally, by choosing different input and output spacings one obtains $$\lambda_{i,r} = \lambda_0 + (i-i_0)w_a - (r-r_0)w_b \qquad (5)$$

where $i_0$, $r_0$ are two particular values of i,r, corresponding to the wavelength $\lambda_0 = \lambda_{i_0 r_0}$ and $w_a$, $w_b$ are determined by the input and output spacings a, b, $$w_a / w_b = a/b.$$

Laser Design

Figure 5:
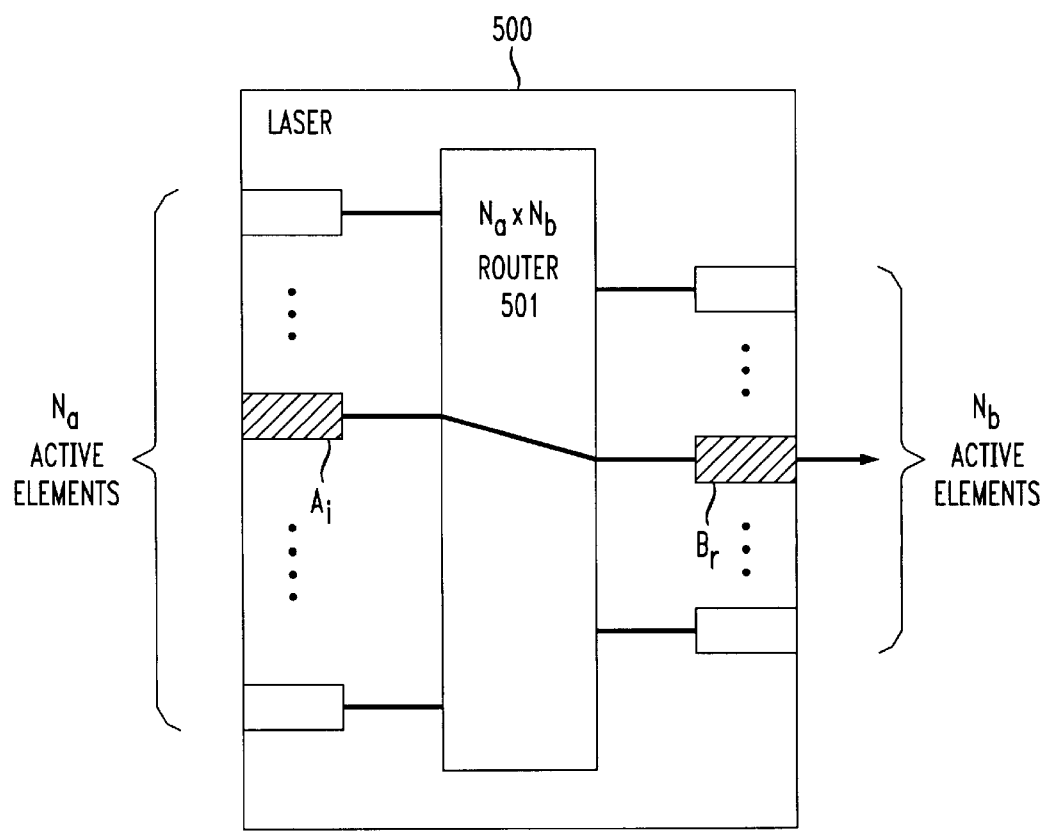
FIG. 5 shows an illustration of a laser used in FIG. 1 implemented using an $N_a \times N_b$ router combined with $N_a+N_b$ control elements.
Figure 6A:
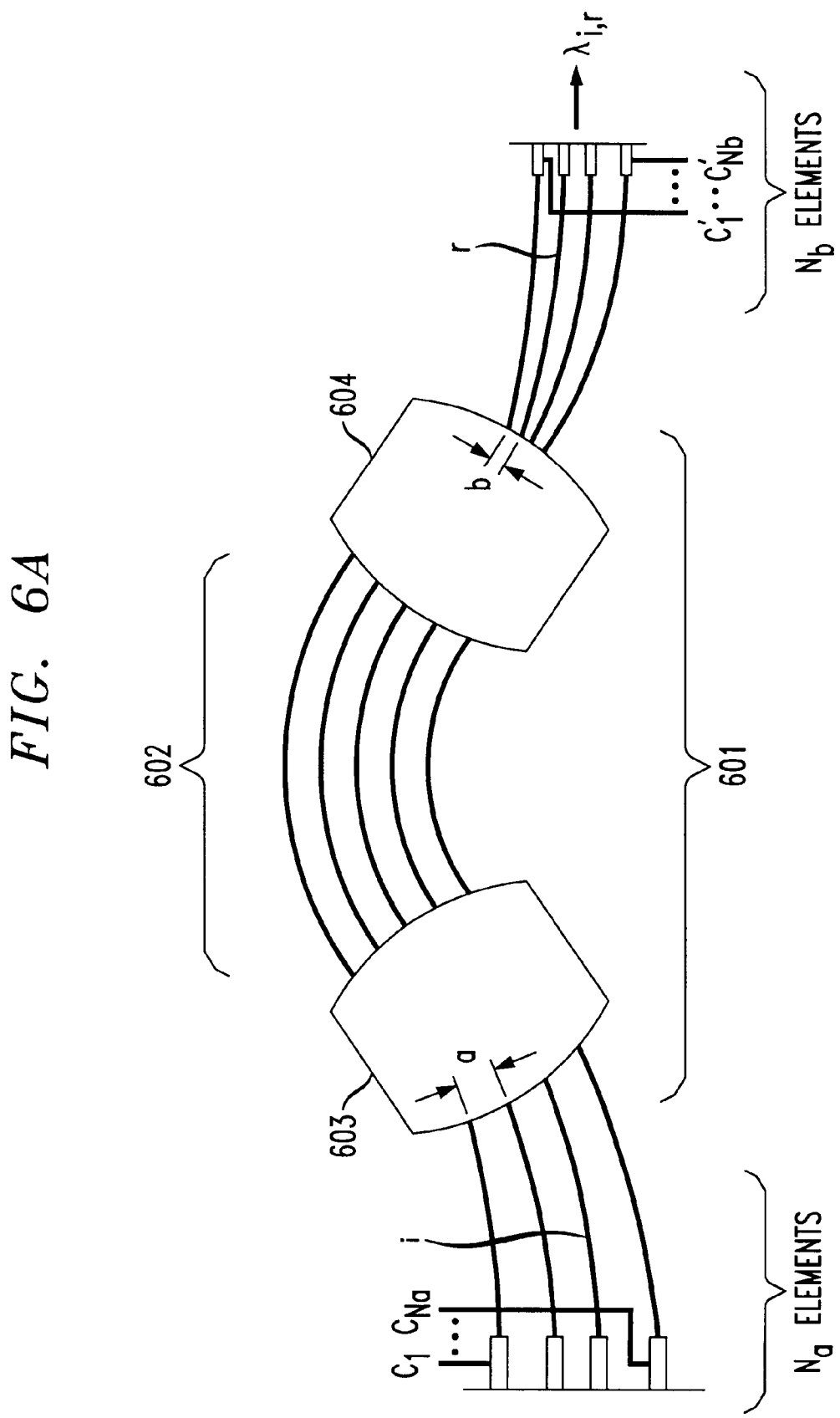
FIG. 6a shows a more detailed implementation of the laser of FIG. 5 realized by including suitable reflections in the input and output waveguides of a waveguide grating router. Each reflection is produced by an active element whose gain or loss can be controlled electronically via a control lead. Shown in FIG. 6b are the wavelengths produced by a particular order $m_0$ when the spacing b of the output waveguides satisfies $b=a/N_b$.

With reference to FIG. 5, consider a laser 500 consisting of an $N_a \times N_b$ router 501 combined with $N_a + N_b$ active elements. The router 501 can be realized using the waveguide grating router 601 as shown in FIG. 6a and, by choosing $N_a = N_b$, the laser can be designed so that the same $N_a$ wavelengths can be produced by each of the output ports. Here we are primarily interested in the general case $N_a \neq N_b$ and assume for simplicity that all wavelengths of interest are produced by a particular order $m_0$ of the grating.

Each element of $N_a$ and $N_b$ in FIG. 6a can be viewed as a reflective termination connected to a particular port of the router 601. Each element of $N_a$ and $N_b$ consists of a reflector combined with a waveguide section having variable gain (or loss) that can be controlled electrically, via control leads $C_1$—$C_{Na}$ and $C'_1$—$C'_{Nb}$. Note that while both sets of the $N_a$ and $N_b$ elements can provide gain usually only one of the element sets would provide the gain and typically that one would be the $N_b$ element set. By activating two particular elements, via their control leads, on opposite sides of the router, a cavity including the router 601 is formed and, by providing sufficient gain, lasing will generally occur at the strongest resonance, typically the one of highest gain. Notice, for the application considered here each laser is only required to produce one wavelength at the time. Therefore in each case, in order to produce a particular wavelength, only two elements (one of $N_a$ and one of $N_b$) are activated while all other elements are set at maximum loss.

Figure 6B:
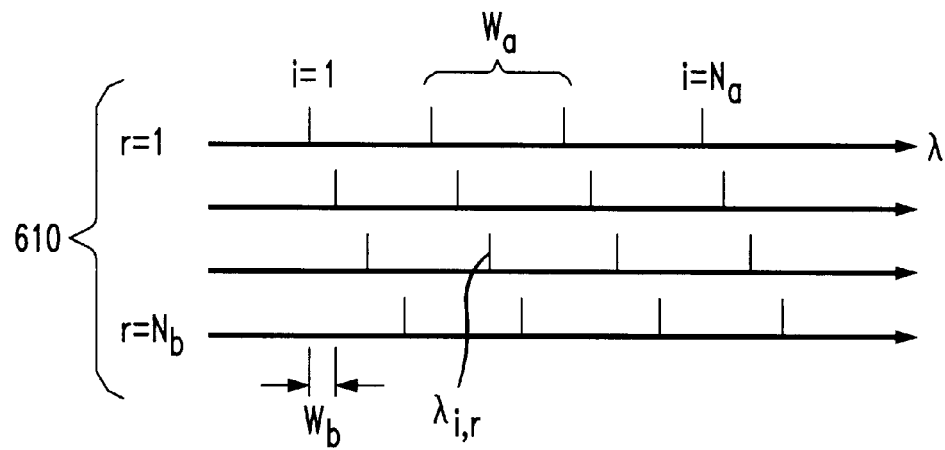

In a conventional router specified by Eq. (2), the waveguides are equally spaced with the same input and output spacing and the same comb of wavelengths are produced from all ports as discussed earlier. Here, however, it is generally convenient to produce from the various output ports of the laser different combs as illustrated by 610 in FIG. 6b. Shown by FIG. 6b are the wavelengths produced by a particular order $m_0$ when the spacing b of the output waveguides satisfies $b=a/N_b$.

For a conventional router, each transmission coefficient between two particular ports has essentially periodic behavior characterized by equally spaced peaks. Here, instead, it is desirable to design the router as in the previous referenced Doerr publication so that one of the above peaks has amplitude appreciably larger than the others. This condition can be satisfied by designing the grating 602 with a quadratic path length variation included in the arms so as to cause the grating focal length to exhibit a strong variation as a function of the wavelength. One can insure by this technique that the peak of largest amplitude is always the one corresponding to a particular order $m_0$ of the grating. Here we assume this condition and let the locations of the input and output waveguides along boundaries of the router free-space regions 603 and 604 be equally spaced by a and b, respectively, as shown in FIG. 6a. Then, the wavelength $\lambda_{i,r}$ produced for $m=m_0$ by activating two particular active elements i,r can be written as Eq. (5), repeated below.

$$\lambda_{i,r}=\lambda_0+(i-i_0)w_a-(r-r_0)w_b \quad (5)$$

where $i_0$, $r_0$ are two particular values of i,r, corresponding to the wavelength $\lambda_0=\lambda_{i_0 r_0}$ and $w_a$, $w_b$ are determined by the input and output spacings a, b.

$$w_a/w_b=a/b.$$

As a result, by choosing $$a/b=N_b.$$

we obtain the set of equally spaced wavelengths, consisting of $N_b$ interleaved combs, each produced by a particular port. As shown in FIG. 6b, each comb consists of $N_a$ wavelengths spaced by $w_a$, and each comb is displaced from the other combs by multiples of $w_b=w_a/N_b$. The i-th wavelength $\lambda_{i,r}$ of the r-th comb is produced by activating the elements $A_i$ and $B_r$ (see FIG. 5). Here we assume that $B_r$ is partially transmitting, so that power at that wavelength can be partially transmitted to a suitable output waveguide. Notice the above laser implementation concept illustrated in FIGS. 5, 6 effectively reduces the number of laser controls by a factor $(N_a+N_b)/N_a N_b$ and this concept can be combined with the temperature tuning concept to further reduce the number of controls or, equivalently, to increase the number of wavelength channels N for a given number of controls.

Figure 7:
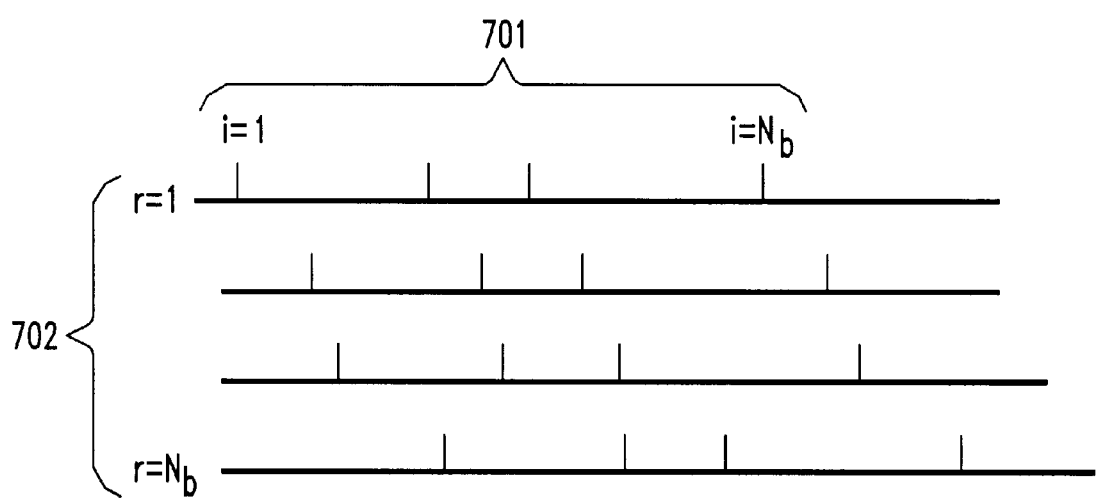
FIG. 7 illustrates that arbitrary spacings for "a" and "b" in FIG. 6, results in arbitrary separation between the wavelengths of each comb and arbitrary displacement of the combs.

With joint reference to FIGS. 6a and b, so far we have assumed that the laser has uniformly spaced combs 610, each comb having uniformly spaced wavelengths $w_a$, in which the spacing "a" of the input waveguides and the spacing "b" of the output waveguides are uniform. More generally with joint reference to FIGS. 6 and 7, by choosing arbitrary waveguide spacings for "a" in FIG. 6, the separation between the wavelengths 701 of each comb can be made not uniform or arbitrary. As before, one of the control leads $N_a$ is used to select one wavelength of a comb. Similarly, by selecting arbitrary spacings for "b" in FIG. 6, the different combs are then not uniformly displaced 702 with respect to each other. Again, one of the control leads $N_b$ is used to select one of the combs or outputs 702.

What has been described is merely illustrative of the application of the principles of the present invention. Other methods and arrangements can be implemented by those skilled in the art without departing from the spirit and scope of the present invention.

What is claimed is:

1. An integrated single output multifrequency laser apparatus comprising laser means for producing $N_a$ $N_b$ wavelengths formed in $N_b$ groups each including $N_a$ wavelengths, each of the $N_b$ groups connected to a different output port of the laser means;

a first laser control apparatus responsive to one of $N_b$ selection signals for selecting one of the $N_b$ groups;

a second laser control apparatus responsive to one of $N_a$ selection signals for enabling any one of the $N_a$ wavelengths of the selected group;

a router integrated with the laser means, the router having $N_b$ input ports, each input port connected to a different one of the laser means $N_b$ output ports, the router having a single output port for outputting one of $N_a N_b$ wavelengths as selected of the $N_a$ and $N_b$ wavelength selection signals.

2. The multifrequency laser of claim 1 wherein the $N_a N_b$ wavelengths are equally spaced by a first wavelength separation and each of the $N_b$ groups include wavelengths spaced by a second wavelength separation equal to $N_b$ times the first separation.

3. The multifrequency laser apparatus of claim 1 wherein the laser means further comprises $N_b$ output ports, each port capable of outputting one of the $N_a$ wavelengths of a particular $N_b$ group.

4. The multifrequency laser apparatus of claim 1 further comprising a waveguide grating router including a first and second free-space regions connected by a plurality of waveguide arms having a quadratic path length variation, an input side of the first free-space region including $N_a$ input waveguides each separated by a spacing "a" and each including a reflective termination which is controlled by a separate one of the $N_a$ control signals, an output side of the second free-space region including $N_b$ output waveguides each separated by a spacing "b", where "a" is equal to $N_b$ times "b", each output waveguide including a reflective termination which is controlled by a separate one of the $N_b$ control signals.

5. An integrated single output multifrequency laser comprising a waveguide grating router including a first and second free-space regions connected by a plurality of waveguide arms having a quadratic path length variation, an input side of the first free-space region including $N_a$ input waveguides each separated by a spacing "a" and each including a reflective termination which is controlled by a different one of a first group of control signals, $1-N_a$, an output side of the second free-space region including $N_b$ output waveguides each separated by a spacing "b", where "a" is equal to $N_b$ times "b", each output waveguide including a reflective termination which is controlled by a separate one of a second group of control signals, $1-N_b$, each reflective termination being partially transmitting and connected as a different output port of the multifrequency laser, a router integrated with the multifrequency laser means, the router having $N_b$ input ports, each input port connected to a different one of the multifrequency laser $N_b$ output ports, the router having a single output port for outputting a wavelength generated by the multifrequency laser, and wherein the multifrequency laser has sufficient gain to lase at one of $N_a N_b$ wavelengths selected using one control signal from the first group of control signals, $1-N_a$, and one control signal from the second group of control signals, $1-N_b$.

6. The multifrequency laser of claim 5 wherein each output port can output one of a comb of $N_a$ equally spaced wavelengths selected using one of the first group of control signals.

7. The multifrequency laser of claim 6 wherein the spacing of wavelengths of said comb is $w_a$ and wherein the spacing between the wavelengths of adjacent output ports is $w_b$, where $w_a$ is $N_b$ times $w_b$.

8. The multifrequency laser of claim 5 wherein the laser gain is provided at each of the $N_a$ input waveguides.

9. The multifrequency laser of claim 5 wherein the laser gain is provided at each of the $N_b$ output waveguides.

10. A method of operating a multifrequency laser comprising the steps of:

in response to one of $N_a$ selection signals, enabling one of a first group of $N_a$ wavelengths, having a first wavelength separation, to be produced by the laser;

in response to one of $N_b$ selection signals, enabling any one of a second group of $N_b$ wavelengths, having a second wavelength separation that is equal to $1/N_b$ of the first wavelength separation, to be produced by the laser;

connecting any of the second group of $N_b$ wavelengths to a single output port of the laser, producing one of $N_a N_b$ wavelengths at the single output port of the laser in response to one of each of the $N_a$ and $N_b$ wavelength selection signals.

* * * * *